(12) United States Patent
Kurokawa et al.

(10) Patent No.: US 11,964,483 B2
(45) Date of Patent: Apr. 23, 2024

(54) PIEZOELECTRIC FILM UTILIZATION DEVICE

(71) Applicant: ROHM CO., LTD., Kyoto (JP)

(72) Inventors: Eitaro Kurokawa, Kyoto (JP); Noriyuki Shimoji, Kyoto (JP); Yoshikazu Fujimori, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 27 days.

(21) Appl. No.: 17/604,940

(22) PCT Filed: Mar. 5, 2020

(86) PCT No.: PCT/JP2020/009520
§ 371 (c)(1),
(2) Date: Oct. 19, 2021

(87) PCT Pub. No.: WO2020/217734
PCT Pub. Date: Oct. 29, 2020

(65) Prior Publication Data
US 2022/0212469 A1 Jul. 7, 2022

(30) Foreign Application Priority Data
Apr. 24, 2019 (JP) .................................. 2019-083070

(51) Int. Cl.
*B41J 2/14* (2006.01)
*B41J 2/16* (2006.01)
*H10N 30/20* (2023.01)

(52) U.S. Cl.
CPC ........... *B41J 2/14233* (2013.01); *B41J 2/161* (2013.01); *B41J 2/1626* (2013.01); *B41J 2/1631* (2013.01);
(Continued)

(58) Field of Classification Search
None
See application file for complete search history.

(56) References Cited

U.S. PATENT DOCUMENTS

2008/0012907 A1* 1/2008 Takahashi ............ B41J 2/14233
347/68
2008/0231146 A1 9/2008 Izumi et al.
(Continued)

FOREIGN PATENT DOCUMENTS

CN 102208524 A 10/2011
JP 2007184816 A 7/2007
(Continued)

OTHER PUBLICATIONS

International Search Report and Written Opinion issued for International Patent Application No. PCT/JP2020/009520, dated May 12, 2020, 9 pages including English translation of Search Report.
(Continued)

*Primary Examiner* — Erica S Lin
(74) *Attorney, Agent, or Firm* — Hamre, Schumann, Mueller & Larson, P.C.

(57) ABSTRACT

An inkjet printing head 1 includes a pressure chamber 5, a movable film formation layer 10 that includes a movable film 10A defining a top surface portion of the pressure chamber 5, and a piezoelectric element 6 that is formed to contact a surface of the movable film 10A at an opposite side from the pressure chamber 5 and having a peripheral edge receded further toward an interior of the pressure chamber 5 than the movable film 10A in plan view. The piezoelectric element 6 includes a lower electrode 7 formed on a surface of the movable film formation layer 10 at the opposite side from the pressure chamber 5, an upper electrode 9 disposed at an opposite side from the movable film formation layer 10 with respect to the lower electrode 7, and a piezoelectric film 8 provided between the upper electrode 9 and the lower electrode 7, and the upper electrode 9 has a thin portion 92 at least at a portion of a peripheral edge portion.

15 Claims, 11 Drawing Sheets

(52) U.S. Cl.
CPC ........ *B41J 2/1646* (2013.01); *H10N 30/2047* (2023.02); *B41J 2002/14491* (2013.01)

(56) References Cited

U.S. PATENT DOCUMENTS

| | | | |
|---|---|---|---|
| 2009/0244206 A1* | 10/2009 | Nakayama | B41J 2/14233 29/25.35 |
| 2010/0079558 A1 | 4/2010 | Shimada | |
| 2011/0228013 A1* | 9/2011 | Ohashi | B41J 2/14233 29/25.35 |
| 2012/0236081 A1 | 9/2012 | Nakayama et al. | |
| 2013/0265370 A1 | 10/2013 | Nagahata | |
| 2015/0097898 A1* | 4/2015 | Hayashi | B41J 2/1645 29/25.35 |
| 2016/0043299 A1 | 2/2016 | Fujimori et al. | |
| 2016/0072039 A1* | 3/2016 | Iida | B41J 2/14233 29/25.35 |
| 2017/0106652 A1* | 4/2017 | Iida | B41J 2/14233 |
| 2018/0331275 A1 | 11/2018 | Fujimori et al. | |

FOREIGN PATENT DOCUMENTS

| | | |
|---|---|---|
| JP | 2007331199 A | 12/2007 |
| JP | 2013016738 | 1/2013 |
| JP | 2013215930 | 10/2013 |
| JP | 2016054286 | 4/2016 |
| WO | 2006129532 A1 | 12/2006 |

OTHER PUBLICATIONS

International Preliminary Report on Patentability issued for International Patent Application No. PCT/JP2020/009520, dated Nov. 4, 2021, 12 pages including English translation.
Extended European Search Report issued for European Patent Application No. 20794409.1, dated May 25, 2023, 7 pages.
First Office Action issued for Chinese Patent Application No. 202080030846.3, dated May 24, 2023, 13 pages including English machine translation.
Second Office Action issued for Chinese Patent Application No. 202080030846.3, dated Oct. 9, 2023, 12 pages including English machine translation.
Notice of Reaasons for Refusal issued for Japanese Patent Application No. 2021-515854, Dispatch Date: Feb. 8, 2024, 10 pages including English machine translation.
Decision of Rejection issued for Chinese Patent Application No. 202080030846.3, dated Jan 20, 2024, 12 pages including English machine translation.

* cited by examiner

PIEZOELECTRIC FILM UTILIZATION DEVICE

TECHNICAL FIELD

The present invention relates to a piezoelectric film utilization device, such as an actuator or sensor, etc., that uses a piezoelectric film.

BACKGROUND ART

An inkjet printing head is known as an actuator that uses a piezoelectric film. An example of such an inkjet printing head is disclosed in Patent Literature 1. The inkjet printing head disclosed in Patent Literature 1 includes a nozzle substrate, a pressure chamber substrate, a movable film (vibrating film), and a piezoelectric element bonded to the movable film. A pressure chamber, into which ink is introduced, is formed in the pressure chamber substrate and the movable film faces the pressure chamber. The piezoelectric element is arranged by laminating a lower electrode, a piezoelectric film, and an upper electrode in that order from the movable film side.

CITATION LIST

Patent Literature

Patent Literature 1: Japanese Patent Application Publication No. 2013-215930

SUMMARY OF INVENTION

Technical Problem

With the arrangement described in Patent Literature 1, the upper electrode is formed to have a uniform thickness. To make a displacement amount of the movable film large, it is preferable for the upper electrode to be thinner in thickness. However, if the upper electrode is made thin in thickness, it increases in electrical resistance and it may not be possible to apply an electric field uniformly to the piezoelectric film. If an applied voltage is then increased, the piezoelectric film may be put in a so-called fatigue state in which the displacement amount decreases or response becomes slow.

An object of the present invention is to provide a piezoelectric film utilization device with which a normal electric field can be applied to a piezoelectric film and a movable film can be made large in displacement amount.

Solution to Problem

A piezoelectric film utilization device according to the present invention includes a cavity, a movable film formation layer that includes a movable film disposed on the cavity and defining a top surface portion of the cavity, and a piezoelectric element that is formed to contact a surface of the movable film at an opposite side from the cavity and having a peripheral edge receded further toward an interior of the cavity than the movable film in plan view, and the piezoelectric element includes a lower electrode formed on a surface of the movable film formation layer at the opposite side from the cavity, an upper electrode disposed at an opposite side from the movable film formation layer with respect to the lower electrode, and a piezoelectric film provided between the upper electrode and the lower electrode, and the upper electrode has a thin portion at least at a portion of a peripheral edge portion.

With this arrangement, a central portion of the upper electrode besides the peripheral edge portion and a portion of the peripheral edge portion besides the thin portion are thick portions. The thick portions are low in electrical resistance value in comparison to the thin portion and therefore, charges can be injected into the piezoelectric film without causing a large voltage drop. On the other hand, in comparison to the thick portions, the thin portion is high in electrical resistance value but is short in distance to a peripheral edge of the upper electrode and short in distance through which charges pass and therefore, an amount of current flowing through the peripheral edge portion is low. A large voltage drop thus does not occur in the thin portion as well.

Consequently, in comparison to a case where an entirety of the upper electrode is of the same thickness as the thick portions, a normal electric field can be applied to the piezoelectric film even if an average thickness is decreased. Since the average thickness can be decreased in comparison to the case where the entirety of the upper electrode is of the same thickness as the thick portions, a displacement amount of the movable film can be increased.

In a preferred embodiment of the present invention, the upper electrode has the thin portion across an entirety of the peripheral edge portion.

In the preferred embodiment of the present invention, the upper electrode has a rectangular shape that is long in one direction in plan view and the upper electrode has thin portions at both side portions.

In the preferred embodiment of the present invention, the upper electrode also has thin portions at both end portions.

In the preferred embodiment of the present invention, the thin portion has a tapered upper surface with which a distance to an upper surface of the piezoelectric film decreases gradually toward the outside.

In the preferred embodiment of the present invention, a length in an inside/outside direction of the thin portion is not less than 0.5 µm in plan view.

In the preferred embodiment of the present invention, an inclination angle of the tapered upper surface with respect to the upper surface of the piezoelectric film is not less than 1 degree and within 8 degrees.

In the preferred embodiment of the present invention, an outer edge portion of the tapered upper surface is formed to a curved surface that is outwardly convex.

In the preferred embodiment of the present invention, the upper electrode is constituted of a laminated film of an $IrO_2$ film that is formed on the upper surface of the piezoelectric film and an Ir film that is laminated on the $IrO_2$ film and the Ir film is present on the $IrO_2$ film at an outer edge portion of the thin portion.

In the preferred embodiment of the present invention, the upper electrode is constituted of a laminated film of an $IrO_2$ film that is formed on the upper surface of the piezoelectric film and an Ir film that is laminated on the $IrO_2$ film and the Ir film is not present on the $IrO_2$ film at an outer edge portion of the thin portion.

In the preferred embodiment of the present invention, the upper electrode is constituted of a laminated film of an $IrO_2$ film that is formed on an upper surface of the piezoelectric film and an Ir film that is laminated on the $IrO_2$ film.

In the preferred embodiment of the present invention, the piezoelectric film is constituted of a material having PZT as a main component.

In the preferred embodiment of the present invention, the lower electrode is constituted of a material having Pt as a main component.

In the preferred embodiment of the present invention, a thickness of the thin portion is constant and the thin portion has an upper surface that is parallel to an upper surface of the piezoelectric film.

In the preferred embodiment of the present invention, a length in an inside/outside direction of the thin portion is not less than 0.5 µm in plan view.

The aforementioned as well as yet other objects, features, and effects of the present invention will be made clear by the following description of the preferred embodiments made with reference to the accompanying drawings.

DESCRIPTION OF EMBODIMENTS

Figure 1:
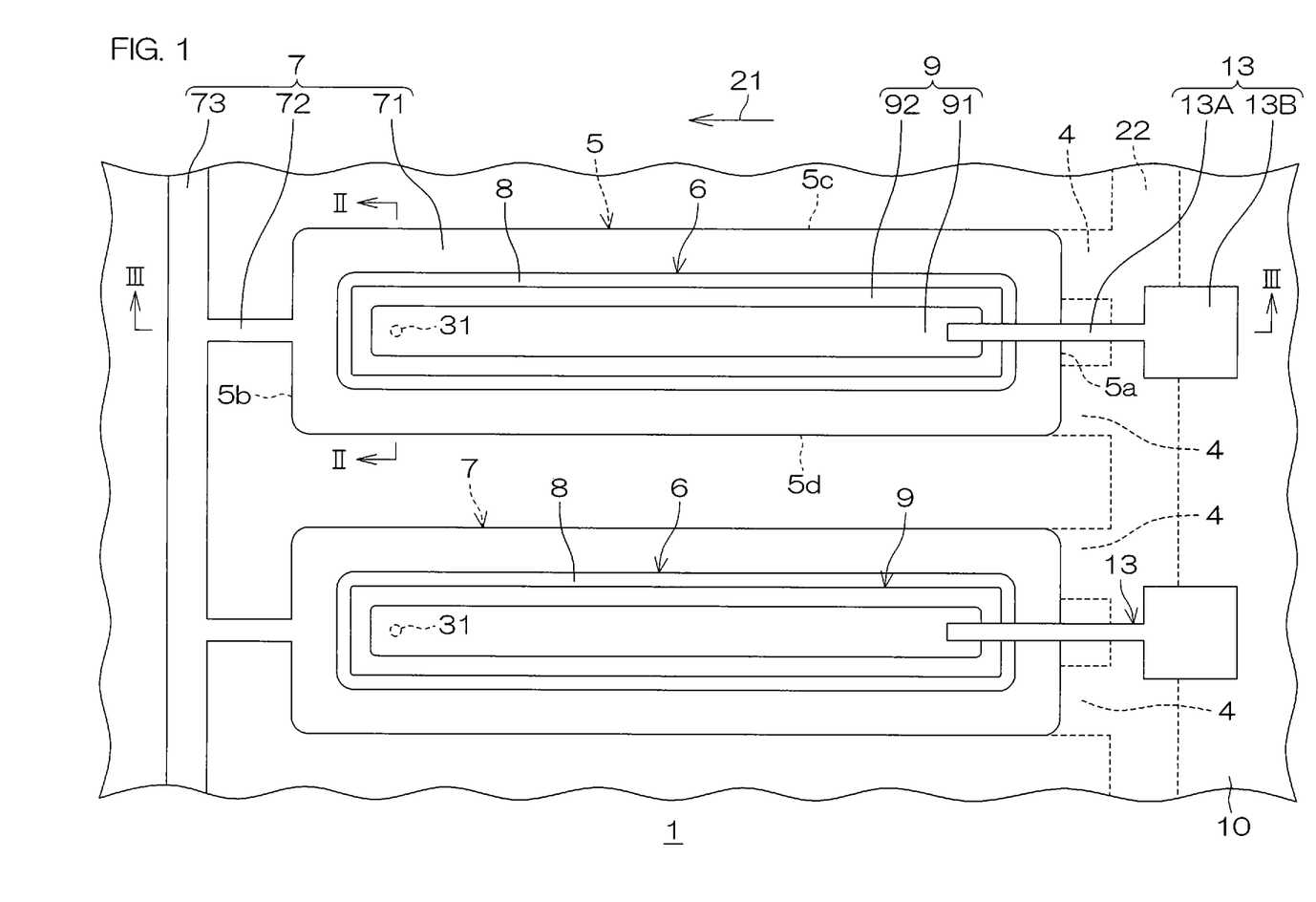
FIG. 1 is a schematic plan view of an inkjet printing head to which a piezoelectric film utilization device according to a preferred embodiment of the present invention is applied.
Figure 2:
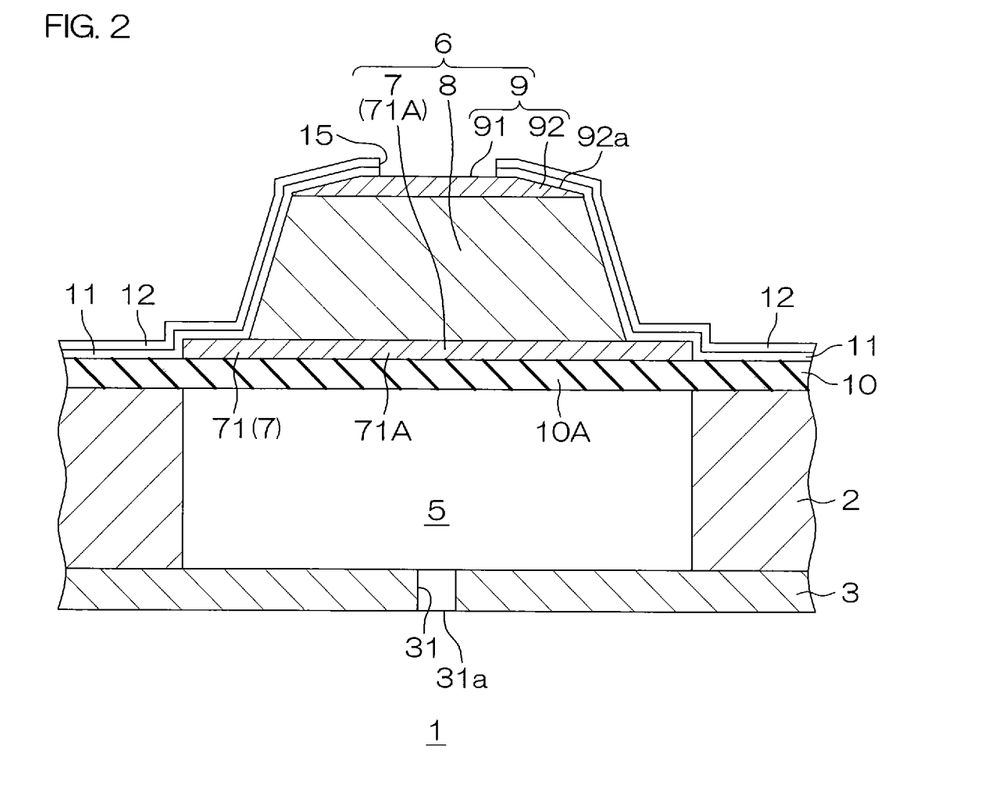
FIG. 2 is a schematic enlarged sectional view taken along line II-II in FIG. 1.
Figure 3:
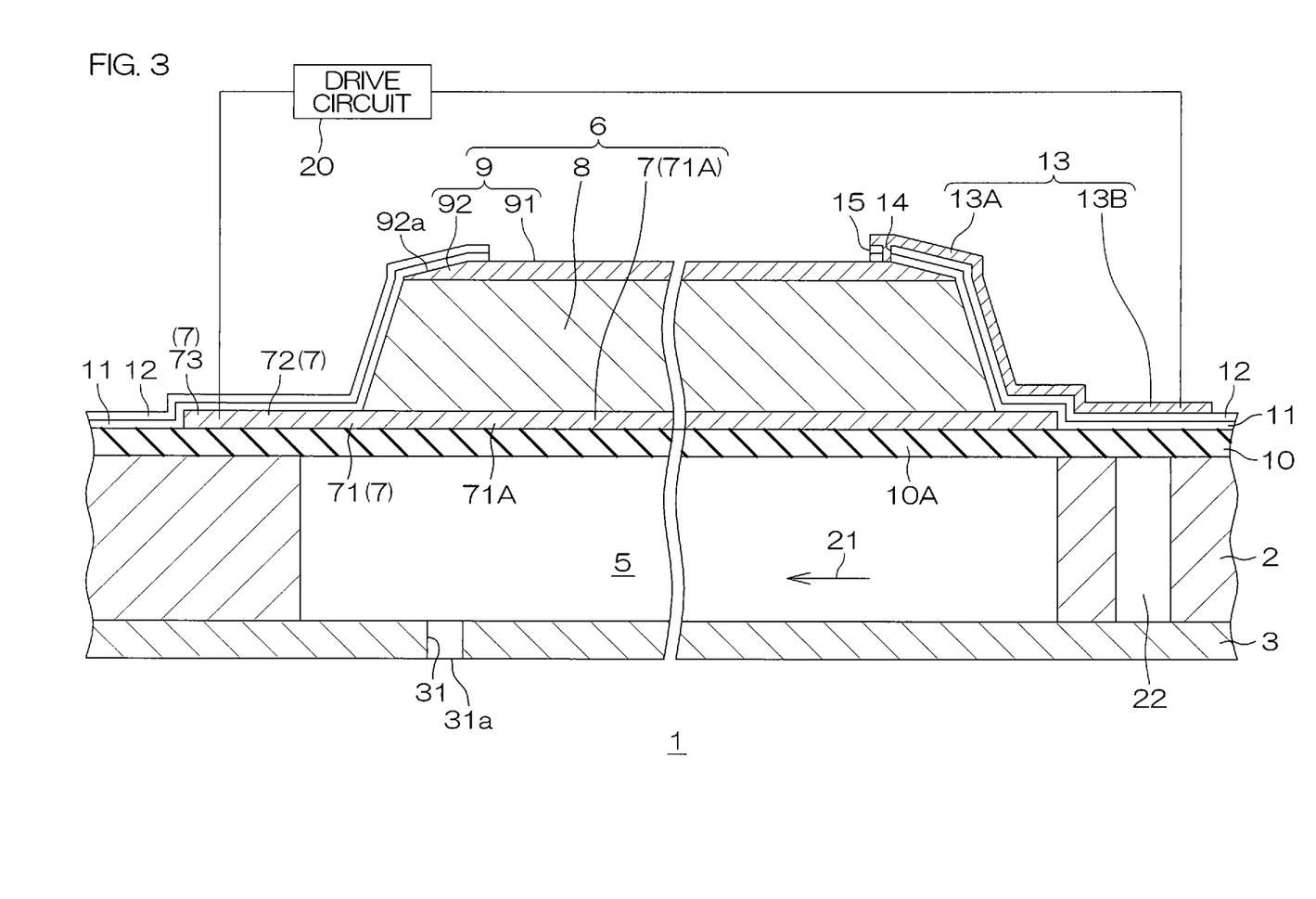
FIG. 3 is a schematic enlarged sectional view taken along line in FIG. 1.
Figure 4A:
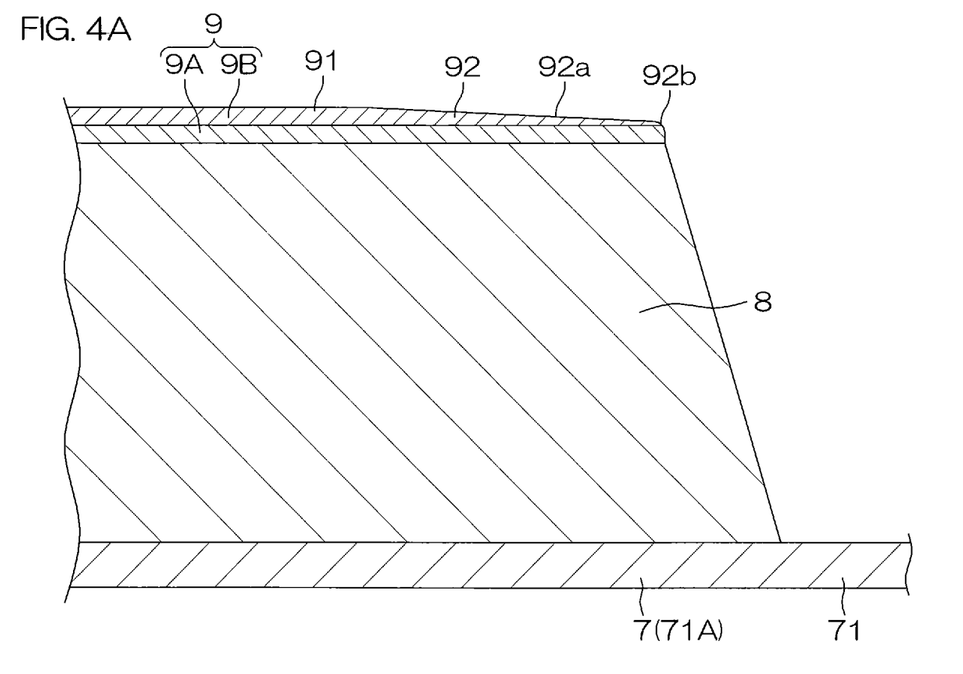
FIG. 4A is a partially enlarged view of an actual shape of mainly a peripheral edge portion of an upper electrode of FIG. 2.

FIG. 1 is a schematic plan view of an inkjet printing head to which a piezoelectric film utilization device according to a preferred embodiment of the present invention is applied. FIG. 2 is a schematic enlarged sectional view taken along line II-II in FIG. 1. FIG. 3 is a schematic enlarged sectional view taken along line III-III in FIG. 1. FIG. 4A is a partially enlarged view of an actual shape of mainly a peripheral edge portion of an upper electrode of FIG. 2. A hydrogen barrier film and an insulating film indicated by the reference signs 11 and 12 in FIG. 2 and FIG. 3 are omitted in FIG. 1 and FIG. 4A.

Referring to FIG. 2 and FIG. 3, the inkjet printing head 1 includes a silicon substrate 2 and a nozzle substrate 3 having discharge ports 31a that discharge ink. A movable film formation layer 10 is laminated on the silicon substrate 2. In the laminate of the silicon substrate 2 and the movable film formation layer 10, pressure chambers (cavities) 5 are formed as ink flow passages (ink reservoirs).

The nozzle substrate 3 is constituted, for example, of a silicon plate, is adhered to a rear surface of the silicon substrate 2, and, together with the silicon substrate 2 and the movable film formation layer 10, defines the pressure chambers 5. Ink discharge passages 31 are formed in the nozzle substrate 3. Each ink discharge passage 31 penetrates through the nozzle substrate 3 and has the discharge port 31a at an opposite side from the pressure chamber 5. Therefore, when a volume change occurs in the pressure chamber 5, the ink retained in the pressure chamber 5 passes through the ink discharge passage 31 and is discharged from the discharge port 31a.

Each pressure chamber 5 is formed by digging into the silicon substrate 2 (or the silicon substrate 2 and the movable film formation layer 10) from the rear surface side of the silicon substrate 2. Ink supply passages 4 (see FIG. 1 and FIG. 3 together), in communication with the pressure chambers 5, are further formed in the silicon substrate 2 (or the silicon substrate 2 and the movable film formation layer 10). The ink supply passages 4 are in communication with the pressure chambers 5 and are formed to guide ink from an ink tank (for example, an ink cartridge) that is an ink supply source to the pressure chambers 5.

Each pressure chamber 5 is formed to be elongate along an ink flow direction 21, which is a right/left direction in FIG. 3. A portion of the movable film formation layer 10 that is a top roof portion of the pressure chamber 5 constitutes a movable film 10A. The movable film 10A (movable film formation layer 10) is constituted, for example, of a silicon oxide ($SiO_2$) film formed on the silicon substrate 2. The movable film 10A (movable film formation layer 10) may instead be constituted of a laminate, for example, of a silicon (Si) layer formed on the silicon substrate 2, a silicon oxide ($SiO_2$) layer formed on the silicon layer, and a silicon nitride (SiN) layer formed on the silicon oxide layer. In the present description, the movable film 10A refers to the portion of the movable film formation layer 10 that is the top roof portion defining the pressure chamber 5. Therefore, portions of the movable film formation layer 10 besides the top roof portion of the pressure chamber 5 do not constitute the movable film 10A.

The movable film 10A has a thickness of, for example, approximately 0.4 µm to 3 µm. In the present preferred embodiment, the thickness of the movable film 10A is approximately 2 µm.

The pressure chamber 5 is defined by the movable film 10A, the silicon substrate 2, and the nozzle substrate and is formed to a substantially rectangular parallelepiped shape in the present preferred embodiment. A length of the pressure chamber 5 is, for example, approximately 600 µm, a width thereof is approximately 100 µm, and a depth thereof is approximately 100 µm. The ink supply passages 4 are formed to be in communication with one end portion (an end portion positioned at an opposite side from the discharge port 31a in the present preferred embodiment) in a long direction of the pressure chamber 5. In the present preferred embodiment, the discharge port 31a of the nozzle substrate 3 is disposed near another end portion related to the long direction of the pressure chamber 5.

The pressure chamber 5 has the rectangular parallelepiped shape and therefore, the movable film 10A has a rectangular shape that is long in the ink flow direction 21 in plan view. The movable film 10A has a length in a long direction of approximately 600 μm and a length in a short direction of approximately 100 μm.

A piezoelectric element 6 is disposed on a front surface of each movable film 10A. The piezoelectric element 6 includes a lower electrode 7 formed on the movable film formation layer 10, a piezoelectric film 8 formed on the lower electrode 7, and an upper electrode 9 formed on the piezoelectric film 8. In other words, the piezoelectric element 6 is arranged by sandwiching the piezoelectric film from above and below by the upper electrode 9 and the lower electrode 7.

The lower electrode 7 is constituted, for example, of a single film that is a Pt (platinum) layer. Besides this, the lower electrode 7 can instead be formed of a single film that is an Au (gold) film, a Cr (chromium) layer, or an Ni (nickel) layer, etc. Also, the lower electrode 7 may instead be formed of a laminated film in which a Ti (titanium) layer and a Pt (platinum) layer are laminated in that order from the movable film 10A side. A film thickness of the lower electrode 7 is, for example, approximately 200 μm.

The lower electrode 7 has a rectangular portion 71 that is disposed on the movable film 10A and has substantially the same shape and size as the movable film 10A, a lead-out electrode portion 72 that is led out from one end side of the rectangular portion 71, and a common connection portion 73 that connects the lower electrodes 7 of a plurality of piezoelectric elements 6 in common. A portion of the rectangular portion 71 that is in contact with a lower surface of the piezoelectric film 8 is a main electrode portion 71A that constitutes the piezoelectric element 6.

Referring to FIG. 3 and FIG. 1, each lead-out electrode portion 72 is led out to a downstream side from a width central portion of a downstream side end in the ink flow direction 21 of the rectangular portion 71. At a further downstream side than the rectangular portions 71, the common connection portion 73 extends in a direction orthogonal to the ink flow direction 21. Downstream side ends of a plurality of lead-out electrode portions 72 are connected to the common connection portion 73.

Returning to FIG. 2 and FIG. 3, as the piezoelectric film 8, for example, a PZT (PbZr$_x$Ti$_{1-x}$O$_3$: lead zirconate titanate) film formed by a sol-gel method or a sputtering method can be applied. Such a piezoelectric film 8 is constituted of a sintered body of a metal oxide crystal. The piezoelectric film 8 preferably has a thickness of 1 μm to 5 μm. In the present preferred embodiment, the thickness of the piezoelectric film 8 is approximately 2 μm. An overall thickness of the movable film 10A is preferably approximately the same as the thickness of the piezoelectric film 8 or approximately ⅔ the thickness of the piezoelectric film 8.

In plan view, the piezoelectric film 8 has a rectangular shape that is long in the ink flow direction 21. Each side surface of the piezoelectric film 8 is formed to an inclined surface that spreads outward toward a lower side. The piezoelectric film 8 is formed with a length in a long direction thereof being shorter than the length in the long direction of the movable film 10A (pressure chamber 5) and both end edges thereof are disposed inwardly at predetermined first intervals from corresponding both end edges of the movable film 10A. A length in a long direction of an upper surface of the piezoelectric film 8 is approximately 500 μm.

The piezoelectric film 8 is formed with a length in a short direction thereof being shorter than the length in the short direction of the movable film 10A (pressure chamber 5) and both side edges thereof are disposed inwardly at predetermined second intervals from corresponding both side edges of the movable film 10A. A length in a short direction of the upper surface of the piezoelectric film 8 is approximately 33 μm.

The upper electrodes 9 are formed to be of substantially the same pattern as the upper surfaces of the piezoelectric films 8. That is, each upper electrode 9 has a rectangular shape that is long in the ink flow direction 21. The upper electrode 9 has, for example, a two-layer structure in which an IrO$_2$ (iridium oxide) film 9A and an Ir (iridium) film 9B are laminated in that order from the piezoelectric film 8 side as shown in FIG. 4A.

In plan view, the upper electrode 9 is constituted of a thick central portion 91 and a thin peripheral edge portion 92 at outer sides of the central portion 91. In plan view, the central portion 91 has a rectangular shape that is long in the ink flow direction 21. A film thickness of the central portion 91 is constant and an upper surface of the central portion 91 is formed to a flat surface that is substantially parallel to the upper surface of the piezoelectric film 8.

The peripheral edge portion 92 has a rectangular annular shape in plan view. In the present preferred embodiment, the peripheral edge portion 92 is formed to a thin portion of tapered shape with which a film thickness decreases gradually towards the outside (outer peripheral edges). In other words, the peripheral edge portion 92 has a tapered upper surface 92a with which a distance to the piezoelectric film 8 upper surface decreases gradually toward the outside.

In the present preferred embodiment, a length in a long direction of the central portion 91 is approximately 497 μm and a length in a short direction of the central portion 91 is approximately 30 μm. Also, in plan view, a length in an inside/outside direction of the peripheral edge portion 92 (width of the peripheral edge portion) is approximately 1.5 μm. The length in the inside/outside direction of the peripheral edge portion 92 is preferably not less than 0.5 μm. In the present preferred embodiment, an inclination angle of the tapered upper surface 92a with respect to the upper surface of the piezoelectric film 8 is approximately 4 degrees. The inclination angle of the tapered upper surface 92a with respect to the upper surface of the piezoelectric film 8 is preferably not less than 1 degree and not more than 8 degrees.

Figure 4B:
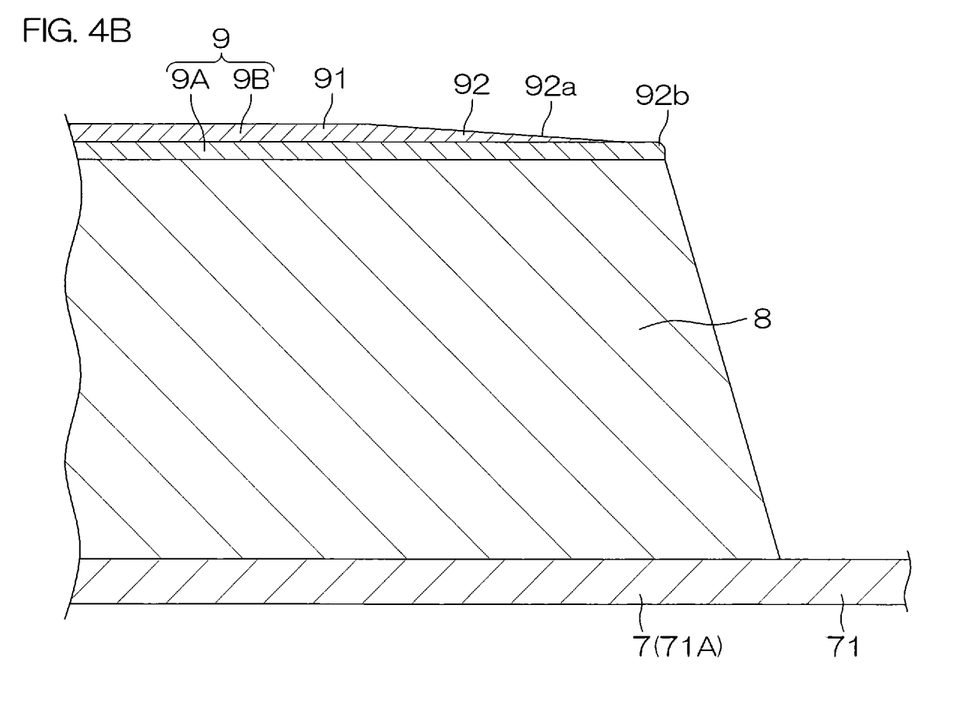
FIG. 4B is a partially enlarged view of a modification example of the shape of the peripheral edge portion of the upper electrode.

As shown in FIG. 4A, an outer edge portion 92b of the tapered upper surface 92a of the peripheral edge portion 92 is formed to a curved surface that is outwardly convex. In FIG. 4A, the Ir film 9B is present on the IrO$_2$ film 9A at the outer edge portion 92b of the peripheral edge portion 92. However, as shown in FIG. 4B, the Ir film 9B does not have to be present on the IrO$_2$ film 9A at the outer edge portion 92b of the peripheral edge portion 92.

A front surface of the movable film formation layer 10, front surfaces of the piezoelectric elements 6, and front surfaces of portions of the lower electrodes 7 besides the main electrode portions 71A are covered with a hydrogen barrier film 11. The hydrogen barrier film 11 is constituted, for example, of Al$_2$O$_3$ (alumina). Degradation of characteristics of the piezoelectric films 8 due to hydrogen reduction can thereby be prevented. A film thickness of the hydrogen barrier film 11 is approximately 100 nm.

An insulating film 12 is laminated on the hydrogen barrier film 11. The insulating film 12 is constituted, for example, of $SiO_2$. Wirings 13 are formed on the insulating film 12. The wirings 13 are constituted of a metal material that includes Al (aluminum).

One end portion of each wiring 13 is disposed above one end portion of the upper electrode 9. A penetrating hole 14 penetrating continuously through the hydrogen barrier film 11 and the insulating film 12 is formed between the wiring 13 and the upper electrode 9. The one end portion of the wiring 13 enters into the penetrating hole 14 and is connected to the upper electrode 9 inside the penetrating hole 14. Also, the hydrogen barrier film 11 and the insulating film 12 have a cutout portion 15 at a position corresponding to a region surrounded by a peripheral edge portion of a front surface of the central portion 91 of each upper electrode 9. The cutout portions 15 are portions at which the hydrogen barrier film 11 and the insulating film 12 are cut out.

Also, although not illustrated, an opening that penetrates continuously through the hydrogen barrier film and the insulating film 12 is formed at a position corresponding to a predetermined region on the common connection portion 73 of the lower electrodes 7 and a front surface of the common connection portion 73 is exposed via the opening. The exposed portion constitutes a pad portion that is arranged to connect the lower electrode 7 to the exterior.

Each piezoelectric element 6 is formed at a position facing the pressure chamber 5 across the movable film 10A. That is, the piezoelectric element 6 is formed to contact a surface of the movable film 10A at the opposite side from the pressure chamber 5. The pressure chamber 5 is filled with ink supplied from an unillustrated ink tank through the ink supply passages 4. The movable film 10A defines a top surface portion of the pressure chamber 5 and faces the pressure chamber 5. The movable film 10A is supported by portions of the laminate of the movable film formation layer 10 and the silicon substrate 2 at a periphery of the pressure chamber 5 and has flexibility enabling deformation in a direction facing the pressure chamber 5 (in other words, in a thickness direction of the movable film 10A).

The wirings 13 and the common connection portion 73 of the lower electrodes 7 are connected to a drive circuit 20. The drive circuit 20 may be formed in a region of the silicon substrate 2 separate from the pressure chambers 5 or may be formed outside the silicon substrate 2. When a drive voltage is applied from the drive circuit 20 to a piezoelectric element 6, the piezoelectric film 8 deforms due to an inverse piezoelectric effect. The movable film 10A is thereby made to deform together with the piezoelectric element 6 to bring about a volume change of the pressure chamber 5 and the ink inside the pressure chamber 5 is pressurized. The pressurized ink passes through the ink discharge passage 31 and is discharged as microdroplets from the discharge port 31a.

Referring to FIG. 1 to FIG. 3, a plurality of the pressure chambers 5 are formed as stripes extending parallel to each other in the silicon substrate 2 (or the laminate of the silicon substrate 2 and the movable film formation layer 10). The plurality of pressure chambers 5 are formed at equal intervals that are minute intervals (for example, of approximately 30 μm to 350 μm) in a width direction thereof.

In plan view, each pressure chamber 5 has an oblong shape that is elongate along the ink flow direction directed from the ink supply passages 4 to the ink discharge passage 31. That is, the top surface portion of the pressure chamber 5 has two side edges 5c and 5d along the ink flow direction 21 and two end edges 5a and 5b along the direction orthogonal to the ink flow direction 21.

At the one end portion of each pressure chamber 5, the ink supply passages 4 are divided and formed as two passages and are in communication with a common ink passage 22. The common ink passage 22 is in communication with the ink supply passages 4 corresponding to the plurality of pressure chambers 5 and is formed to supply the ink from the ink tank to the ink supply passages 4.

Each wiring 13 is constituted of a lead-out portion 13A having one end portion connected to one end portion of the upper electrode 9 at an upstream side in the ink flow direction 21 and extending in a direction opposite to the ink flow direction 21 and a pad portion 13B of rectangular shape in plan view that is made integral to the lead-out portion 13A and connected to a tip of the lead-out portion 13A. With the exception of the portion connected to the upper electrode 9, the lead-out portion 13A is formed on a front surface of the insulating film 12 that covers one end portion of the upper surface of the piezoelectric element 6, an end surface of the piezoelectric element 6 continuous thereto, and the front surface of the movable film formation layer 10. The pad portion 13B is formed on the insulating layer 12 that covers the front surface of the movable film formation layer 10.

An annular region (a rectangular annular region that is long in the ink flow direction 21 in the present preferred embodiment) of each movable film 10A between peripheral edges of the movable film 10A and peripheral edges of the piezoelectric element 6 is a region that is not constrained by the piezoelectric element 6 or a peripheral wall of the pressure chamber 5 and is a region in which a large deformation occurs. That is, a peripheral edge portion of the movable film 10A is a region in which a large deformation occurs. Therefore, when the piezoelectric element 6 is driven, the peripheral edge portion of the movable film 10A bends such that an inner peripheral edge side of the peripheral edge portion of the movable film 10A is displaced in a thickness direction of the pressure chamber 5 (downward in the present preferred embodiment) and an entirety of a central portion surrounded by the peripheral edge portion of the movable film 10A is thereby displaced in the thickness direction of the pressure chamber 5 (downward in the present preferred embodiment).

A method for manufacturing the inkjet printing head 1 shall now be described specifically.

FIG. 5A to 5M are sectional views of a manufacturing process of the inkjet printing head 1 and are sectional views corresponding to the section plane of FIG. 2.

Figure 5A:
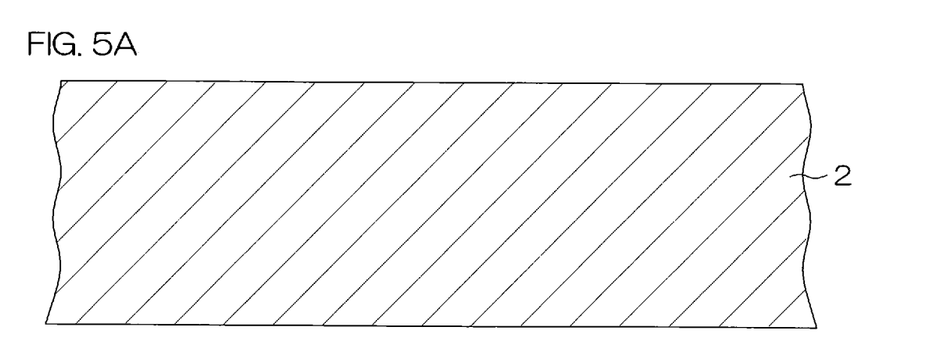
FIG. 5A is a sectional view of an example of a manufacturing process of the inkjet printing head.

First, as shown in FIG. 5A, the silicon substrate 2 is prepared. Here, as the silicon substrate 2, that which is thicker in thickness than the silicon substrate 2 at the final stage is prepared.

Figure 5B:
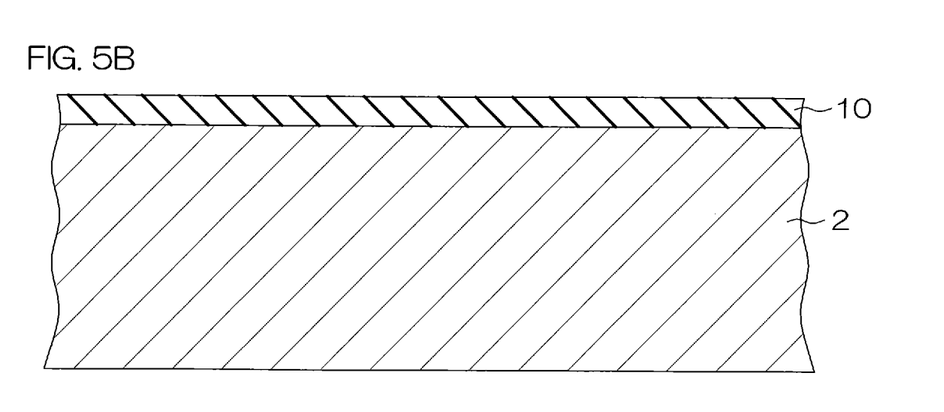
FIG. 5B is a sectional view of a step subsequent to that of FIG. 5A.

Next, as shown in FIG. 5B, the movable film formation layer 10 is formed on the front surface of the silicon substrate 2. Specifically, a silicon film (for example, of 2 μm thickness) is formed on the front surface of the silicon substrate 2. If the movable film formation layer 10 is constituted of a laminated film of a silicon film, a silicon oxide film, and a silicon nitride film, the silicon film (for example, of 0.6 μm thickness) is formed on the front surface of the silicon substrate 2, the silicon oxide film (for example, of 0.6 μm thickness) is formed on the silicon film, and the silicon nitride film (for example, of 0.6 μm thickness) is formed on the silicon oxide film.

Figure 5C:
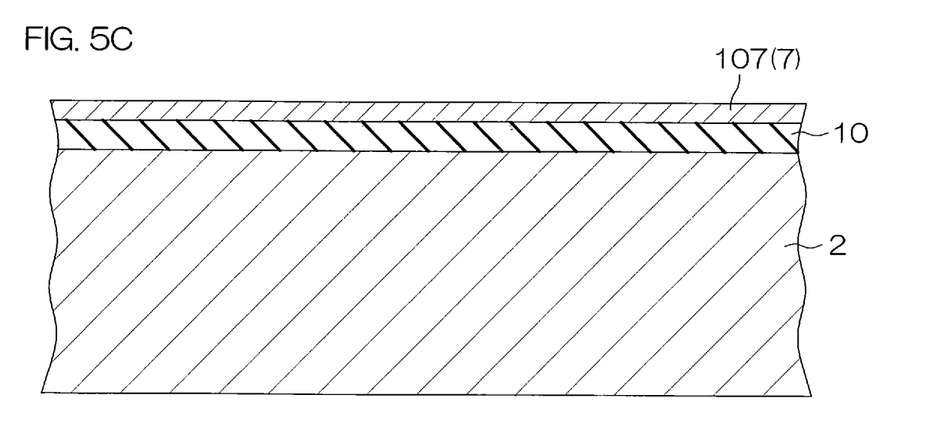
FIG. 5C is a sectional view of a step subsequent to that of FIG. 5B.

Next, as shown in FIG. 5C, a lower electrode film 107 that is a material layer of the lower electrodes 7 is formed on the movable film formation layer 10. The lower electrode film 107 is constituted, for example, of a Pt film (for example, of 200 nm thickness). Such a lower electrode film 107 is formed, for example, by a sputtering method.

Figure 5D:
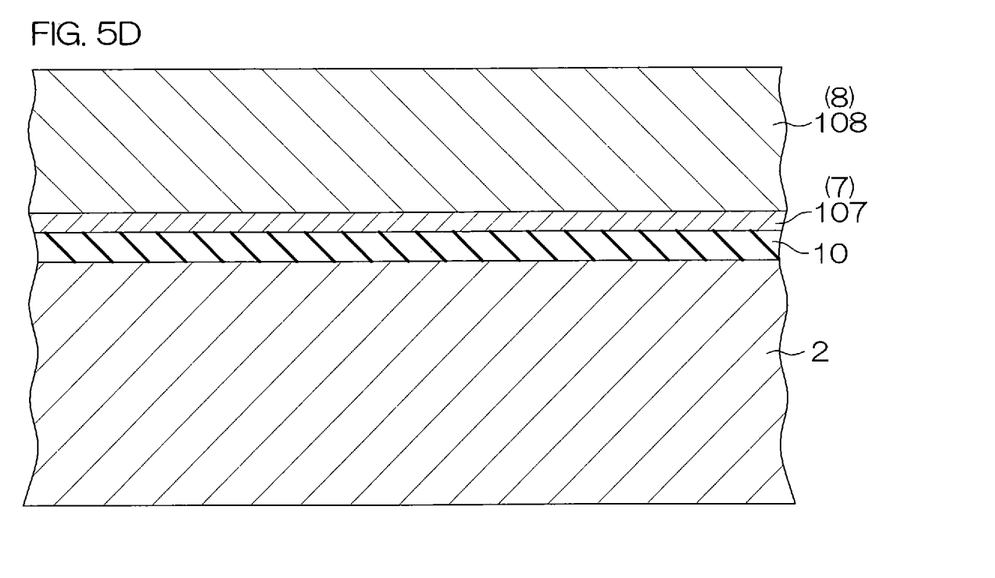
FIG. 5D is a sectional view of a step subsequent to that of FIG. 5C.

Next, as shown in FIG. 5D, a piezoelectric material film 108 that is a material of the piezoelectric films 8 is formed on an entire surface of the lower electrode film 107. Specifically, the piezoelectric material film 108 of, for example, 2 μm thickness is formed by, for example, a sol-gel method. Such a piezoelectric material film 108 is constituted of a sintered body of metal oxide crystal grains.

Figure 5E:
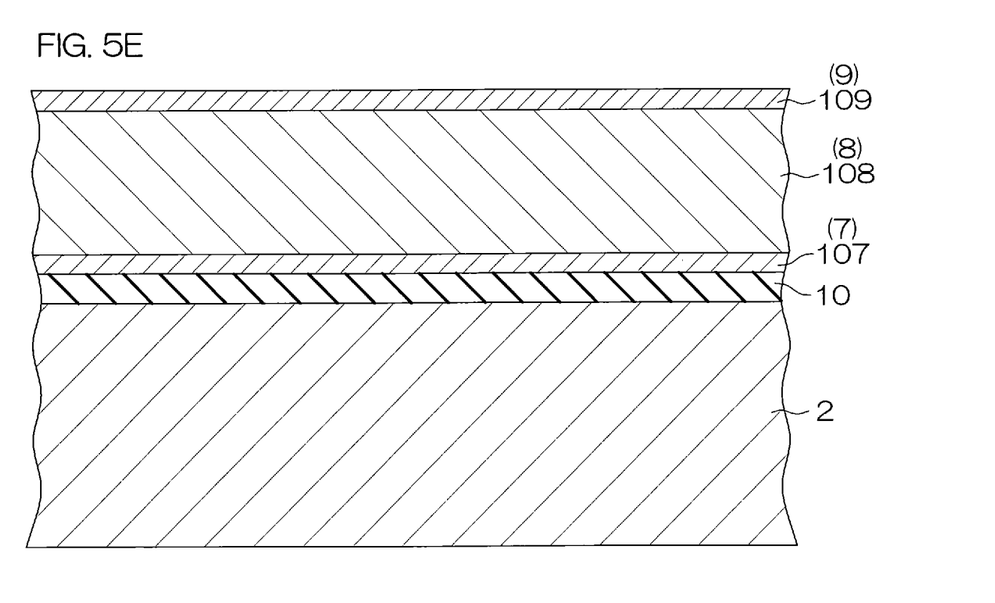
FIG. 5E is a sectional view of a step subsequent to that of FIG. 5D.

Next, as shown in FIG. 5E, an upper electrode film 109 that is a material of the upper electrodes 9 is formed on an entire surface of the piezoelectric material film 108. The upper electrode film 109 is constituted, for example, of an $IrO_2/Ir$ laminated film having an $IrO_2$ film (for example, of 50 nm thickness) as a lower layer and an Ir film (for example, of 50 nm thickness) as an upper layer. Such an upper electrode film 109 is formed by a sputtering method.

Figure 5F:
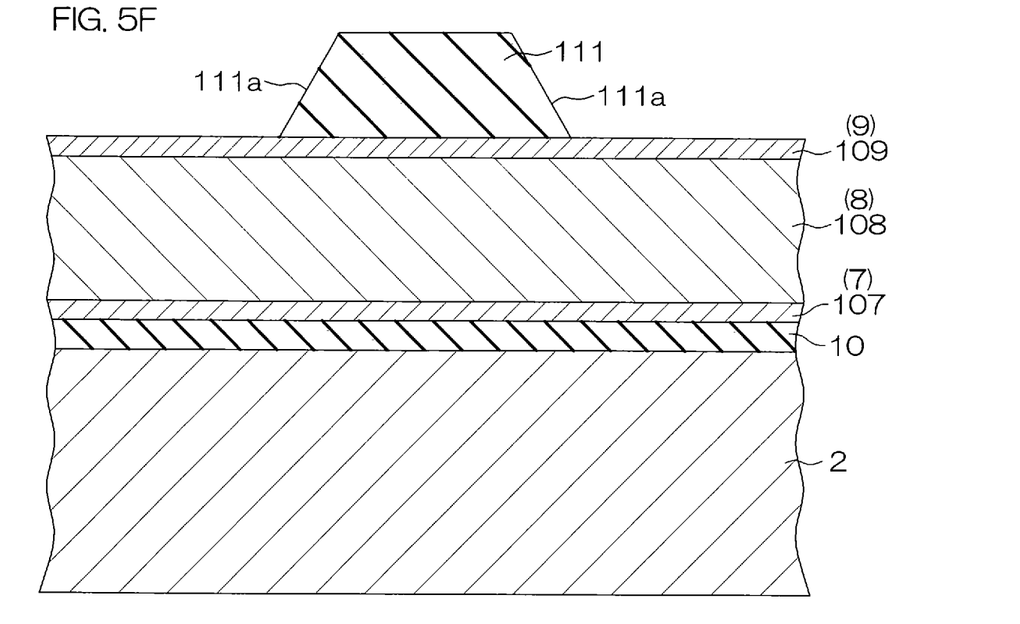
FIG. 5F is a sectional view of a step subsequent to that of FIG. 5E.

Next, as shown in FIG. 5F, a resist mask 111 with a pattern of the upper electrodes 9 is formed by photolithography. Each side surface 111a of the resist mask 111 is formed to an inclined surface that spreads outward toward a lower side.

Figure 5G:
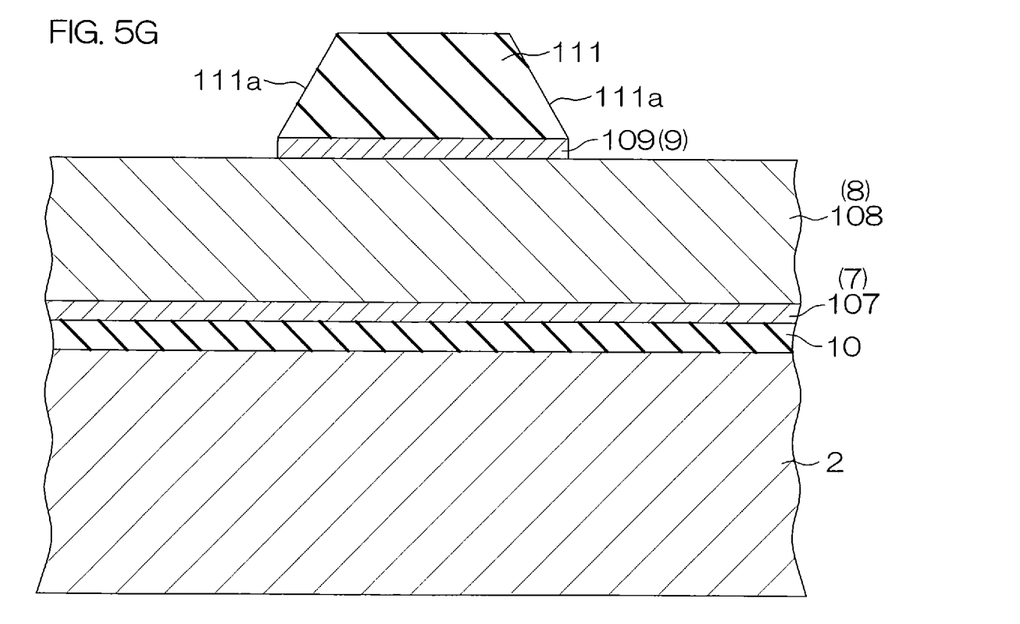
FIG. 5G is a sectional view of a step subsequent to that of FIG. 5F.
Figure 5H:
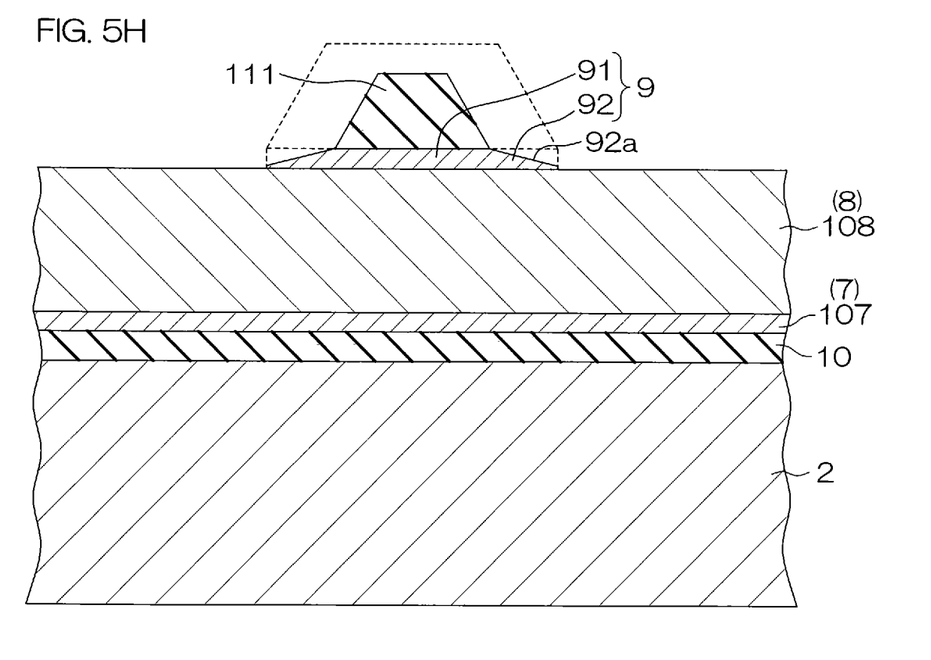
FIG. 5H is a sectional view of a step subsequent to that of FIG. 5G.

Next, as shown in FIG. 5G and FIG. 5H, the upper electrode film 109 is etched using the resist mask 111 as a mask to form the upper electrodes 9 of a predetermined pattern. In the etching step, as shown in FIG. 5H, a front surface and the side surfaces 111a of inclined shapes of the resist mask 111 are etched gradually such that an etching amount increases toward outer sides at upper surface peripheral edge portions of the upper electrodes 9. Consequently, the upper electrode 9 each constituted of the central portion (thick portion) 91 that is constant in film thickness and the peripheral edge portion (thin portion) 92 with which the film thickness decreases gradually toward the outside is obtained. The peripheral edge portion 92 has the tapered upper surface 92a with which the distance to the piezoelectric film 8 upper surface decreases gradually toward the outside. The outer edge portion 92b of the peripheral edge portion 92 is formed to the curved surface that is outwardly convex.

Figure 5I:
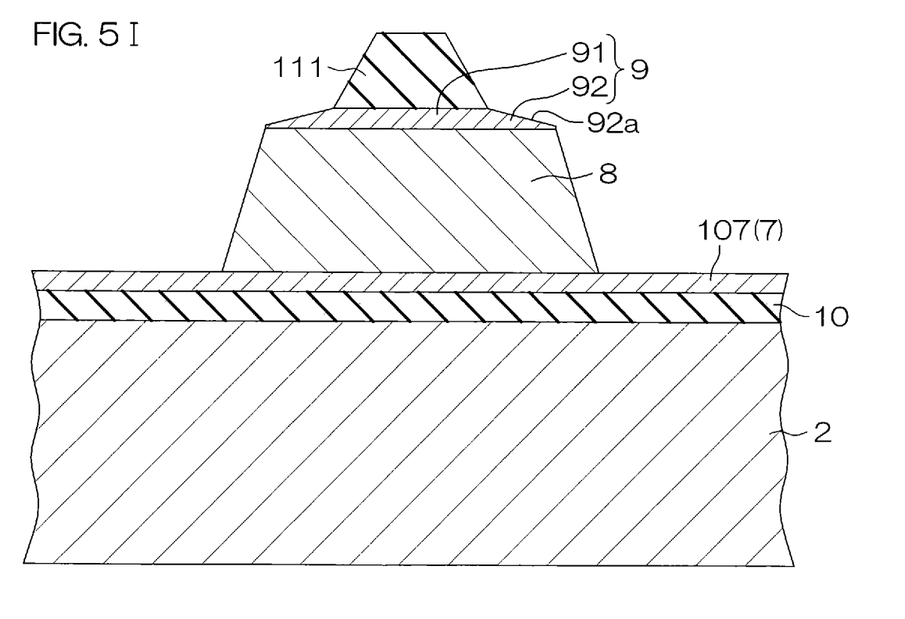
FIG. 5I is a sectional view of a step subsequent to that of FIG. 5H.

Next, as shown in FIG. 5I, the piezoelectric material film 108 is etched to form the piezoelectric films 8 of a predetermined pattern. Thereafter, the resist mask 111 is peeled off.

Figure 5J:
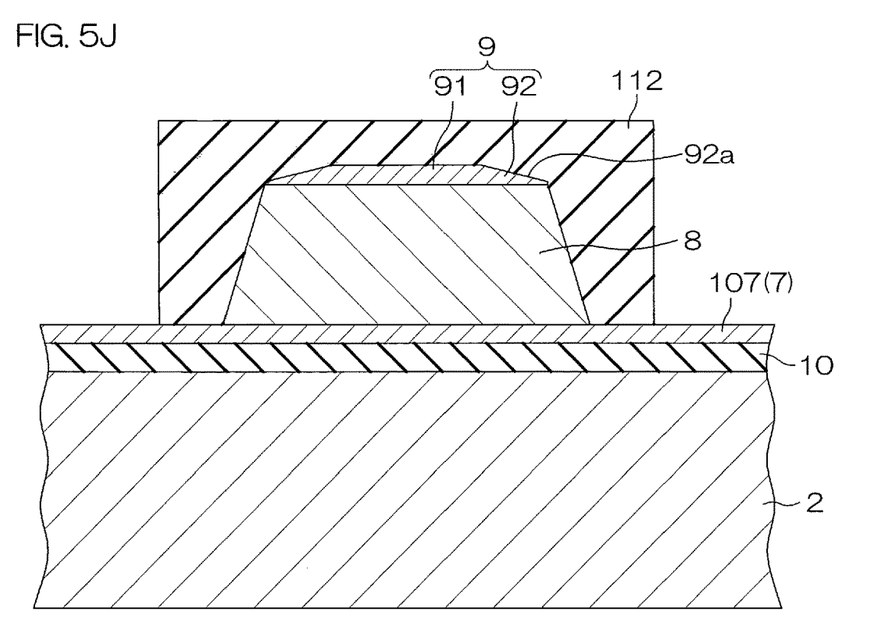
FIG. 5J is a sectional view of a step subsequent to that of FIG. 5I.

Next, as shown in FIG. 5J, a resist mask 112 with a pattern of the lower electrodes 7 is formed by photolithography.

Figure 5K:
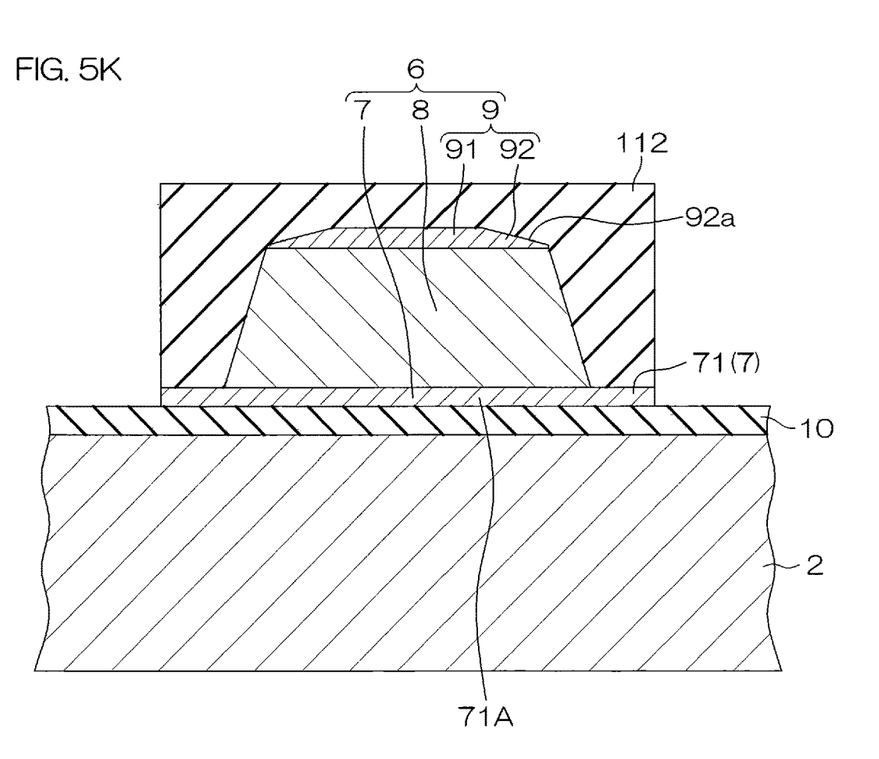
FIG. 5K is a sectional view of a step subsequent to that of FIG. 5J.

Next, as shown in FIG. 5K, the lower electrode film 107 is etched using the resist mask 112 as a mask to form the lower electrodes 7 that are each constituted of the rectangular portion 71 including the main electrode portion 71A, the lead-out electrode portion 72, and the common connection portion 73. Thereafter, the resist mask 112 is peeled off.

Figure 5L:
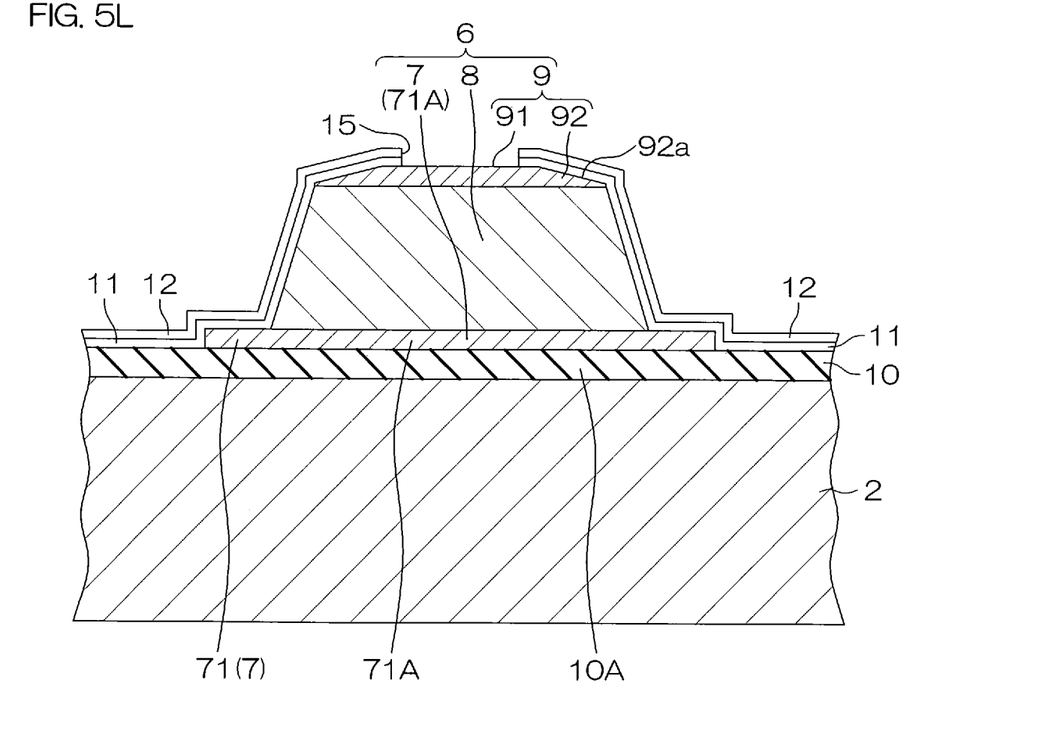
FIG. 5L is a sectional view of a step subsequent to that of FIG. 5K.

Next, the hydrogen barrier film 11 covering the whole surface is formed. Thereafter, the insulating film 12 is formed on an entire surface of the hydrogen barrier film 11. Subsequently, the insulating film 12 and the hydrogen barrier film 11 are etched successively to form the penetrating holes 14. A wiring film that constitutes the wirings 13 is formed on the insulating film 12, including interiors of the penetrating holes 14, by a sputtering method. Thereafter, the wiring film is patterned by photolithography and etching to form the wirings 13. Thereafter, as shown in FIG. 5L, the insulating film 12 and the hydrogen barrier film 11 are etched successively to form the cutout portions 15.

Figure 5M:
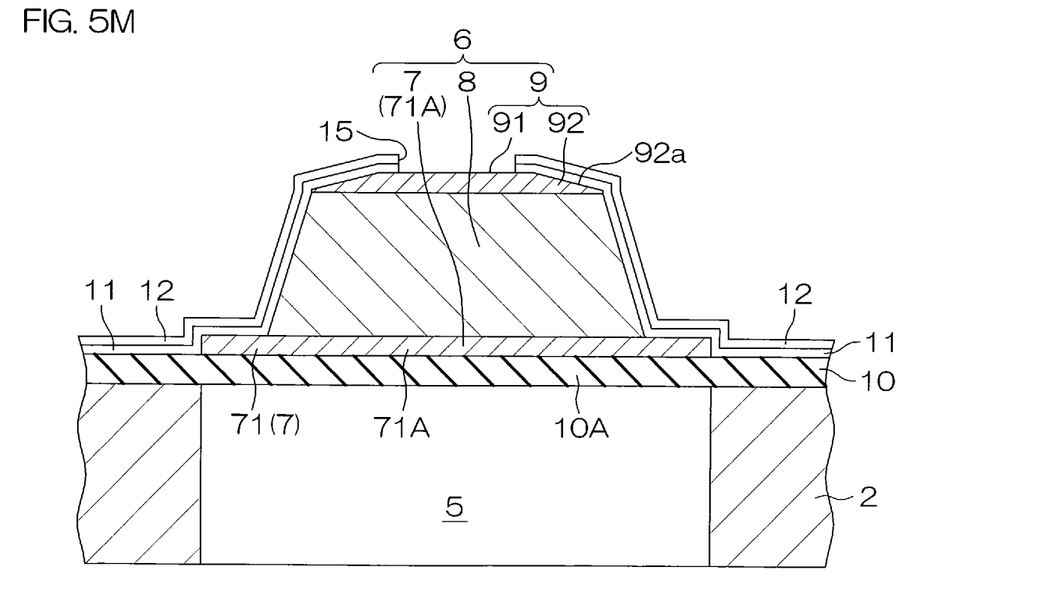
FIG. 5M is a sectional view of a step subsequent to that of FIG. 5L.

Next, as shown in FIG. 5M, rear surface grinding for thinning the silicon substrate 2 is performed. The silicon substrate 2 is polished from the rear surface to make the silicon substrate 2 into a thin film. For example, the silicon substrate 2 of approximately 670 μm thickness in an initial state is thinned to approximately 100 μm thickness. Thereafter, the common ink passage 22, the ink supply passages 4, and the pressure chambers 5 are formed in the silicon substrate 2 by photolithography and etching.

Lastly, the nozzle substrate 3 is adhered to the rear surface of the silicon substrate 2 and the inkjet printing head 1 such as shown in FIG. 1 to FIG. 4A is thereby obtained.

With the preferred embodiment described above, each upper electrode 9 is constituted of the thick central portion 91 and the thin peripheral edge portion 92 at the outer sides of the central portion 91. The film thickness of the central portion 91 is constant. The peripheral edge portion 92 is formed to the thin portion of tapered shape with which the film thickness decreases gradually towards the outside. In other words, the peripheral edge portion 92 has the tapered upper surface 92a with which the distance to the piezoelectric film 8 upper surface decreases gradually toward the outside.

The central portion (thick portion) 91 is low in electrical resistance value in comparison to the peripheral edge portion (thin portion) 92 and therefore, charges can be injected into the piezoelectric film 8 without causing a large voltage drop. On the other hand, in comparison to the central portion 91, the peripheral edge portion 92 is high in electrical resistance value but is short in distance to the peripheral edge of the upper electrode 9 and short in distance through which charges pass and therefore, an amount of current flowing through the peripheral edge portion 92 is low. A large voltage drop thus does not occur in the peripheral edge portion 92 as well.

Consequently, in comparison to a case where an entirety of the upper electrode 9 is of the same thickness as the central portion 91, a normal electric field can be applied to the piezoelectric film 8 even if an average thickness is decreased. Since the average thickness can be decreased in comparison to the case where the entirety of the upper electrode 9 is of the same thickness as the central portion 91, a displacement amount of the movable film 10A can be increased.

Although with the preferred embodiment described above, an entirety of the peripheral edge portion of each upper electrode 9 is formed to the thin portion of tapered shape, just a portion of the peripheral edge portion of the upper electrode 9 may be formed to a thin portion of tapered shape instead. For example, of the both side portions and the both end portions of the upper electrode 9, just the both side portions may be formed to thin portions of tapered shapes.

Also, although with the preferred embodiment described above, each upper electrode 9 has the rectangular shape in plan view, a planar shape of the upper electrode 9 may instead be a circular shape, an elliptical shape, or any other shape.

Figure 6:
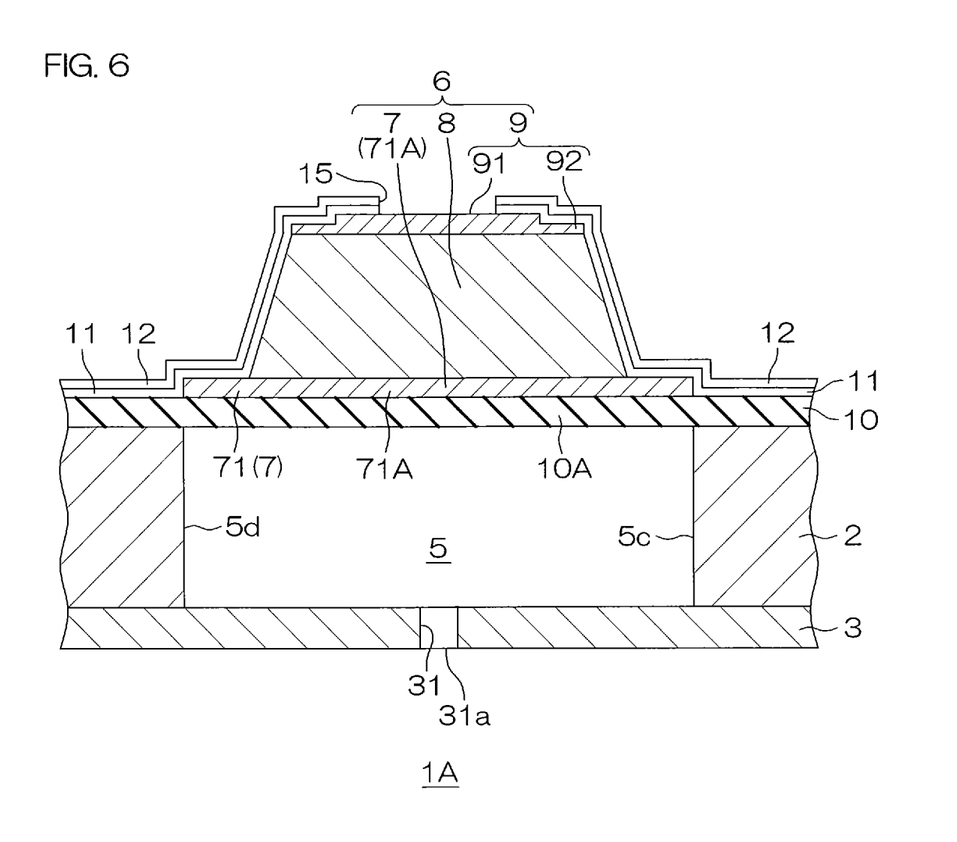
FIG. 6 is a sectional view for describing the arrangement of an inkjet printing head according to another preferred embodiment and is a sectional view corresponding to FIG. 2.

Also, although with the preferred embodiment described above, the peripheral edge portion 92 of the upper electrode 9 is formed to the thin portion of tapered shape, the peripheral edge portion 92 of the upper electrode 9 may instead be formed to a thin portion that is thinner than the central portion 91 and is of a constant thickness as in an inkjet printing head 1A shown in FIG. 6. FIG. 6 is a sectional view corresponding to FIG. 2. Even in this case, the length in the inside/outside direction of the peripheral edge portion 92 in plan view is preferably not less than 0.5 μm. With the example of FIG. 6, the length in the inside/outside direction of the peripheral edge portion 92 is approximately 1.5 μm.

Also, although with the preferred embodiments described above, the insulating film 12 is formed on the hydrogen barrier film 11, the insulating film 12 does not have to be formed on the hydrogen barrier film 11.

Also, although with the preferred embodiments described above, cases where the present invention is applied to an inkjet printing head was described, the present invention can also be applied to a microphone, pressure sensor, acceleration sensor, angular velocity sensor, ultrasonic sensor, speaker, or IR sensor (heat sensor), etc., that uses a piezoelectric film.

While preferred embodiments of the present invention were described in detail above, these are merely specific examples used to clarify the technical contents of the present invention and the present invention should not be interpreted as being limited to these specific examples and the scope of the present invention is limited only by the appended claims.

The present application corresponds to Japanese Patent Application No. 2019-083070 filed on Apr. 24, 2019 in the Japan Patent Office, and the entire disclosure of this application is incorporated herein by reference.

REFERENCE SIGNS LIST 1, 1A Inkjet printing head
2 Silicon substrate
3 Nozzle substrate
31 Ink discharge passage
31a Discharge port
4 Ink supply passage
5 Pressure chamber (cavity)
6 Piezoelectric element
7 Lower electrode
71 Rectangular portion
71A Main electrode portion
72 Lead-out electrode portion
73 Common connection portion
8 Piezoelectric film
9 Upper electrode
9A $IrO_2$ film
9B Ir film
91 Central portion
92 Peripheral edge portion
92a Tapered upper surface
92b Outer edge portion
10 Movable film formation layer
10A Movable film
11 Hydrogen barrier film
12 Insulating film
13 Wiring
13A Lead-out portion
13B Pad portion
14 Penetrating hole
15 Cutout portion
20 Drive circuit
21 Ink flow direction
22 Common ink passage
107 Lower electrode film
108 Piezoelectric material film
109 Upper electrode film
111, 112 Resist mask

The invention claimed is:

1. A piezoelectric film utilization device comprising:
a cavity;
a movable film formation layer that includes a movable film disposed on the cavity and defining a top surface portion of the cavity; and
a piezoelectric element that is formed to contact a surface of the movable film at an opposite side from the cavity and having a peripheral edge receded further toward an interior of the cavity than the movable film in plan view; and
wherein the piezoelectric element includes a lower electrode formed on a surface of the movable film formation layer at the opposite side from the cavity, an upper electrode disposed at an opposite side from the movable film formation layer with respect to the lower electrode, and a piezoelectric film provided between the upper electrode and the lower electrode,
the upper electrode has a thin portion at least at a portion of a peripheral edge portion,
the lower electrode includes a main electrode portion in contact with a lower surface of the piezoelectric film and portions extending outward from a periphery of the main electrode portion, and
the piezoelectric film utilization device further includes:
a hydrogen barrier film covering a front surface of the movable film formation layer, front surfaces of the piezoelectric element, and front surfaces of the lower electrode besides the main electrode portion; and
an insulating film laminated on the hydrogen barrier film, wherein the hydrogen barrier film and the insulating film have a cutout portion at a position corresponding to a region surrounded by a peripheral edge portion of a front surface of a central portion of the upper electrode.

2. The piezoelectric film utilization device according to claim 1, wherein the upper electrode has the thin portion across an entirety of the peripheral edge portion.

3. The piezoelectric film utilization device according to claim 1, wherein the upper electrode has a rectangular shape that is long in one direction in plan view and
the upper electrode has thin portions at both side portions.

4. The piezoelectric film utilization device according to claim 3, wherein the upper electrode also has thin portions at both end portions.

5. The piezoelectric film utilization device according to claim 1, wherein the thin portion of the upper electrode has a tapered upper surface with which a distance to an upper surface of the piezoelectric film decreases gradually toward the outside.

6. The piezoelectric film utilization device according to claim 5, wherein a length in an inside/outside direction of the thin portion is not less than 0.5 μm in plan view.

7. The piezoelectric film utilization device according to claim 5, wherein an inclination angle of the tapered upper surface with respect to the upper surface of the piezoelectric film is not less than 1 degree and within 8 degrees.

8. The piezoelectric film utilization device according to claim 5, wherein an outer edge portion of the tapered upper surface is formed to a curved surface that is outwardly convex.

9. The piezoelectric film utilization device according to claim 5, wherein the upper electrode is constituted of a laminated film of an $IrO_2$ film that is formed on the upper surface of the piezoelectric film and an Ir film that is laminated on the $IrO_2$ film and the Ir film is present on the $IrO_2$ film at an outer edge portion of the thin portion.

10. The piezoelectric film utilization device according to claim 5, wherein the upper electrode is constituted of a laminated film of an $IrO_2$ film that is formed on the upper surface of the piezoelectric film and an Ir film that is laminated on the $IrO_2$ film and the Ir film is not present on the $IrO_2$ film at an outer edge portion of the thin portion.

11. The piezoelectric film utilization device according to claim 1, wherein the upper electrode is constituted of a laminated film of an IrO$_2$ film that is formed on an upper surface of the piezoelectric film and an Ir film that is laminated on the IrO$_2$ film.

12. The piezoelectric film utilization device according to claim 1, wherein the piezoelectric film is constituted of a material having PZT as a main component.

13. The piezoelectric film utilization device according to claim 1, wherein the lower electrode is constituted of a material having Pt as a main component.

14. The piezoelectric film utilization device according to claim 1, wherein a thickness of the thin portion is constant and the thin portion has an upper surface that is parallel to an upper surface of the piezoelectric film.

15. The piezoelectric film utilization device according to claim 14, wherein a length in an inside/outside direction of the thin portion is not less than 0.5 µm in plan view.

* * * * *